(12) United States Patent
Terashi

(10) Patent No.: US 7,623,219 B2
(45) Date of Patent: Nov. 24, 2009

(54) EXPOSURE APPARATUS, EXPOSURE METHOD, DEVICE MANUFACTURING METHOD

(75) Inventor: Takaaki Terashi, Saitama (JP)

(73) Assignee: Canon Kabushiki Kaisha (JP)

( * ) Notice: Subject to any disclaimer, the term of this patent is extended or adjusted under 35 U.S.C. 154(b) by 411 days.

(21) Appl. No.: 11/613,591

(22) Filed: Dec. 20, 2006

(65) Prior Publication Data

US 2007/0146673 A1   Jun. 28, 2007

(30) Foreign Application Priority Data

Dec. 22, 2005   (JP) .............................. 2005-369329

(51) Int. Cl.
   *G03B 27/54* (2006.01)
   *G03B 27/72* (2006.01)
(52) U.S. Cl. .......................................... 355/67; 355/71
(58) Field of Classification Search ............ 355/67, 355/71, 69, 75

See application file for complete search history.

(56) References Cited

U.S. PATENT DOCUMENTS

2003/0081191 A1* 5/2003 Nishi et al. .................... 355/69
2005/0042525 A1   2/2005 Takenaka et al.

FOREIGN PATENT DOCUMENTS

JP   2000-252193   9/2000
JP   2005-031287   2/2005

* cited by examiner

*Primary Examiner*—Peter B Kim
(74) *Attorney, Agent, or Firm*—Rossi, Kimms & McDowell LLP

(57) ABSTRACT

An exposure method for exposing a pattern of a reticle which has a patterned area that has the pattern, and a light shielding area provided around the patterned area, said exposure method includes the step of illuminating the reticle via an illumination optical system that includes a field stop, wherein a position corresponding to an edge of an aperture in the field stop is closer to the patterned area than a center of a width of the light shielding area on the reticle, the aperture defining a region for illuminating the reticle.

10 Claims, 14 Drawing Sheets

EXPOSURE APPARATUS, EXPOSURE METHOD, DEVICE MANUFACTURING METHOD

BACKGROUND OF THE INVENTION

The present invention relates generally to an exposure apparatus, an exposure method, and a device manufacturing method, and more particularly to an exposure apparatus, an exposure method, and a device manufacturing method that use an original, such as a reticle and a mask, which has a circuit or another pattern.

The pattern exposure technology that transfers an LSI pattern of a reticle onto a wafer is required to promote fine processing to a transferable pattern, and to reduce the cost of the exposure apparatus. In general, the exposure process uses a light blocking plate (field stop) called a masking blade to restrict a region of the light and to prevent the exposure light from reaching an unnecessary region on the reticle (mask). However, when a set exposure area of the masking blade is as large as an imaging pattern region, the device imaging precision lowers at and near a position corresponding to the aperture edge or contour in the masking blade due to the blur (or aberration) at the aperture edge. Therefore, a light shielding area is provided around the reticle pattern, and the masking blade is made wider in the opening direction by half the width of the light shielding area, preventing a degradation of the imaging precision. See, for example, Japanese Patent Application, Publication No. 2000-252193.

However, as the numerical aperture ("NA") of the projection optical system becomes higher, the light can be reflected on the light shielding area, then on the reticle back surface that opposes to the patterned surface, and finally return to the reticle patterned surface. Then, the light is incident as the stray or unnecessary light upon the projection optical system and then the wafer at the adjacent part to the pattern transfer area, causing the critical dimension ("CD") abnormality in the adjacent part. This phenomenon will be described with reference to FIG. 9. Here, FIG. 9 is a schematic view of the incident light upon the reticle when the aperture edge of the masking blade is set to the center of the light shielding area. 200 denotes the reticle, 201 the light shielding area, Ws a width of the light shielding area, and 202 the patterned area. The aperture edge of the masking blade is set to the center of the light shielding area 201 or at a position that shifts from the boundary between the patterned area 202 and the light shielding area 201 by Wi=Ws/2. Now address a ray OB1 corresponding to the aperture edge of the masking blade. The ray OB1 is incident upon the reticle at a comparatively small angel $\theta c_1$, and reaches the reticle pattern plane. The ray OB1 is partially reflected onto the reticle back plane, and again partially reflected there onto the light shielding area 201. Thus, the ray OB1 is shielded by the light shielding area 201. On the other hand, a ray $OB_2$ having an incident angle $\theta c_2$ greater than the angle $\theta c_1$ of the ray $OB_1$ is reflected on the light shielding area 201 and then on the reticle back plane. The ray $OB_2$ that returns to the reticle pattern plane leaks to the outside of the light shielding area 201. The ray $OB_2$ passes the projection optical system, and reaches the adjacent area to the transfer area on the wafer, causing the CD abnormality that thickens or thins the CD there. A method of applying an antireflection film to the reticle back plane is one measure to avoid this phenomenon. See, for example, Japanese Patent Application, Publication No. 2005-031287.

However, the method of this reference forms the antireflection coating on the back plane of the reticle 20, and has a problem of making the reticle expensive. As a result, the manufacturing cost of the exposure apparatus using the reticle increases.

Another conceivable measure is to sufficiently widen the light shielding area, but the excessively wide light shielding part undesirably widens one exposure or shot area and lowers the device arrangement efficiency on the wafer.

SUMMARY OF THE INVENTION

The present invention is directed to an exposure apparatus, an exposure method, and a device manufacturing method, which can provide the cost reduction as well as the fine patterning.

An exposure method according to one aspect of the present invention for exposing a pattern of a reticle which has a patterned area that has the pattern, and a light shielding area provided around the patterned area, said exposure method includes the step of illuminating the reticle via an illumination optical system that includes a field stop, wherein a position corresponding to an edge of an aperture in the field stop is closer to the patterned area than a center of a width of the light shielding area on the reticle, the aperture defining a region for illuminating the reticle.

An exposure apparatus according to another aspect of the present invention for exposing onto a substrate a pattern of a reticle that has a patterned area that has the pattern, and a light shielding area provided around the patterned area, said exposure apparatus comprising an illumination optical system for illuminating the pattern of the reticle, the illumination optical system including a field stop having an aperture that defines a region for illuminating the reticle, wherein a position corresponding to an edge of an aperture in a field stop is closer to the patterned area than a center of a width of the light shielding area.

A device manufacturing method according to another aspect of the present invention includes the steps of exposing a substrate using the above exposure apparatus or method, and developing the substrate that has been exposed.

Other objects and further features of the present invention will become readily apparent from the following description of the preferred embodiments with reference to accompanying drawings.

DESCRIPTION OF THE EMBODIMENTS

Figure 1:
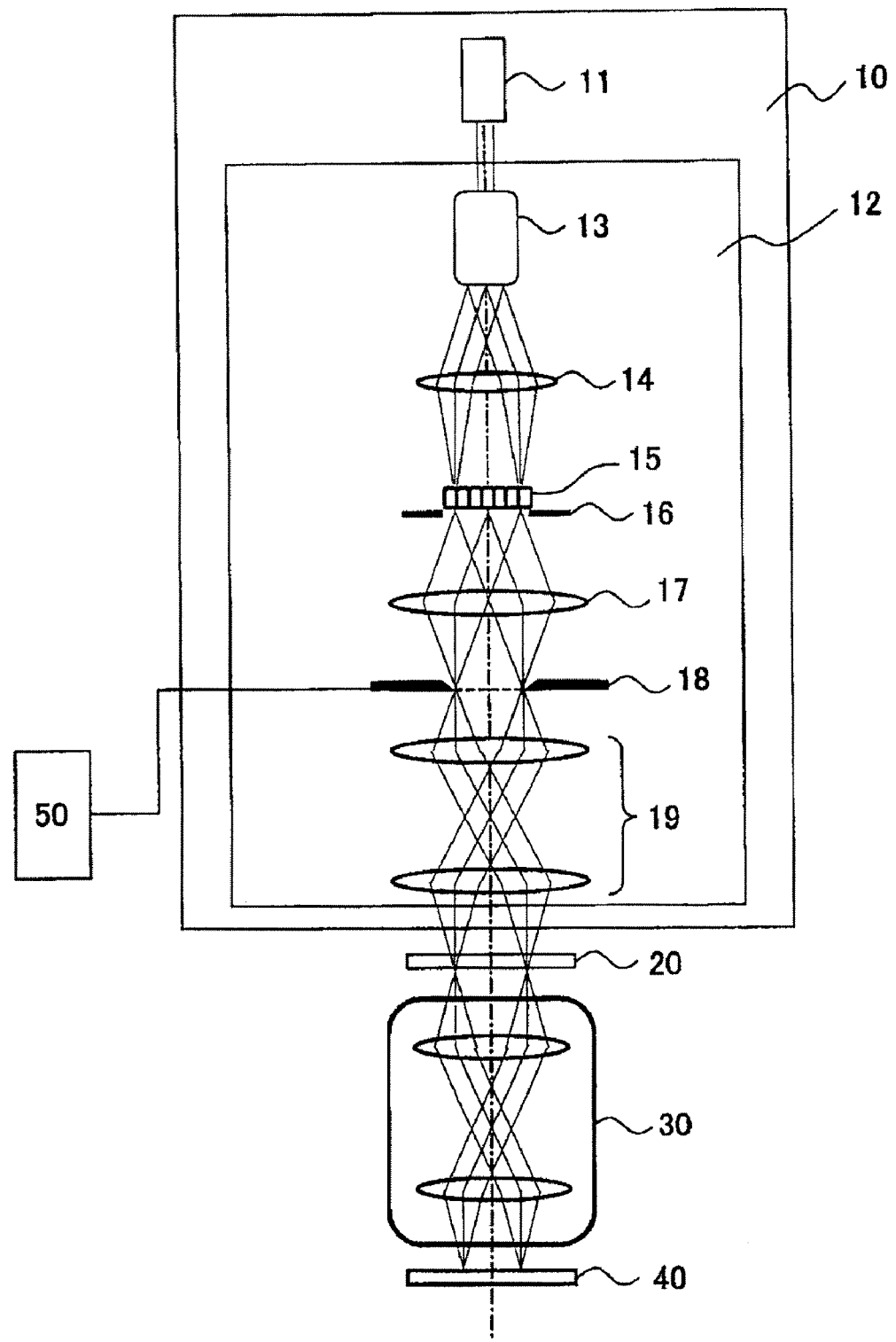
FIG. 1 is a block diagram showing a structure of an exposure apparatus.

Referring now to the accompanying drawings, a preferred embodiment of the present invention will be described. The same element in each figure will be designated by the same reference numeral, and a detailed description will be omitted. FIG. 1 is a block diagram showing a structure of the exposure apparatus 1.

The exposure apparatus 1 is a projection exposure apparatus that exposes a circuit pattern of a reticle 20 onto a wafer 40 in a step-and-scan manner. The exposure apparatus 1 is suitable for a lithography process below the sub-micron and quarter micron. The exposure apparatus 1 includes, as shown in FIG. 1, an illumination apparatus 10, a reticle stage (not shown) that supports the reticle 20, a projection optical system 30, a wafer stage (not shown), a focus tilt detection system, and a controller 50.

The illumination apparatus 10 illuminates the reticle 20 that has a circuit pattern to be transferred. The illumination apparatus 10 includes a light source unit 11, and an illumination optical system 12.

The light source unit 11 uses, for example, a laser, such as an ArF excimer laser with a wavelength of approximately 193 nm, and a KrF excimer laser with a wavelength of approximately 248 nm. The type of the light source is not limited to an excimer laser, and may use, for example, an $F_2$ laser with a wavelength of approximately 157 nm, an extreme ultraviolet ("EUV") light having a wavelength below 20 nm, and a mercury lamp having a wavelength of 365 nm.

The illumination optical system 12 illuminates a target plane using the light from the light source unit 11, shapes the light into an exposure slit having an optimal shape, and illuminates the reticle 20 in this embodiment. The illumination optical system 12 includes a beam shaping part 13, a relay optical system 14, an optical integrator 15, an aperture stop 16, a condenser lens 17, a masking blade 18, and an imaging optical system 19. The illumination optical system 12 can use both axial and off-axial lights.

The beam shaping part 13 shapes the light from the light source 11 into the desired light, and is arranged between the light source unit 11 and the relay optical system 14.

The relay optical system 14 transmits the light from the beam shaping part 13 to the optical integrator 15, and is arranged between them.

The optical integrator 15 includes a fly-eye lens, or an integrator that has two pairs of stacked cylindrical lens array plates or lenticular lenses. Alternatively, the optical integrator 15 may be replaced with an optical rod or a diffraction optical element.

The aperture stop 16 has a flange or flat ring shape with a limited aperture, and limits the light from the optical integrator 15. The aperture stop 16 is arranged between the optical integrator 15 and the condenser lens 17.

The condenser lens 17 condenses the light from the optical integrator 15 on the object plane of the imaging optical system 19. The condenser lens 17 is arranged between the aperture stop 16 and the masking blade 18.

Figure 2:
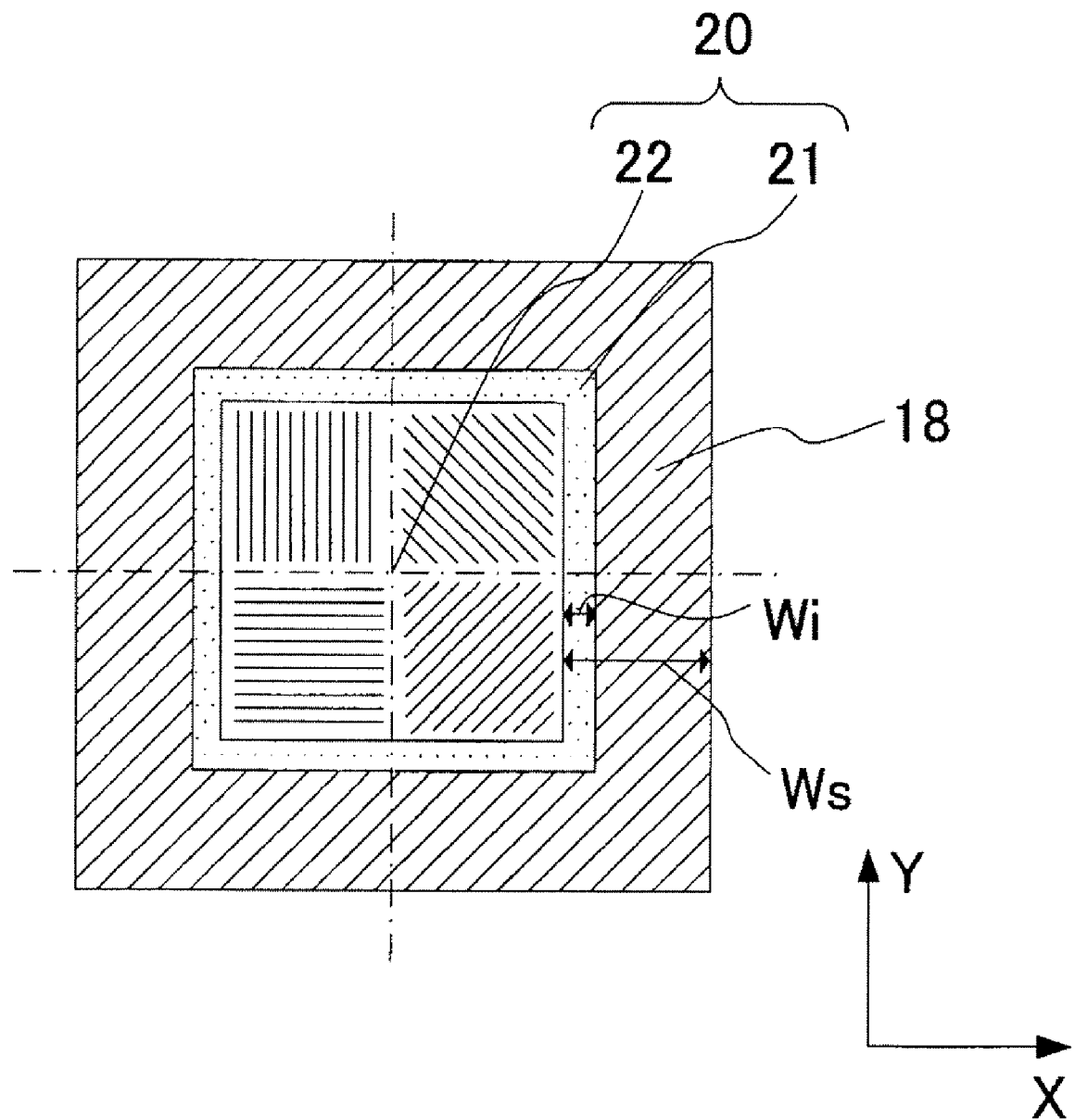
FIG. 2 is a top view showing a reticle and a masking blade in this embodiment.
Figure 3:
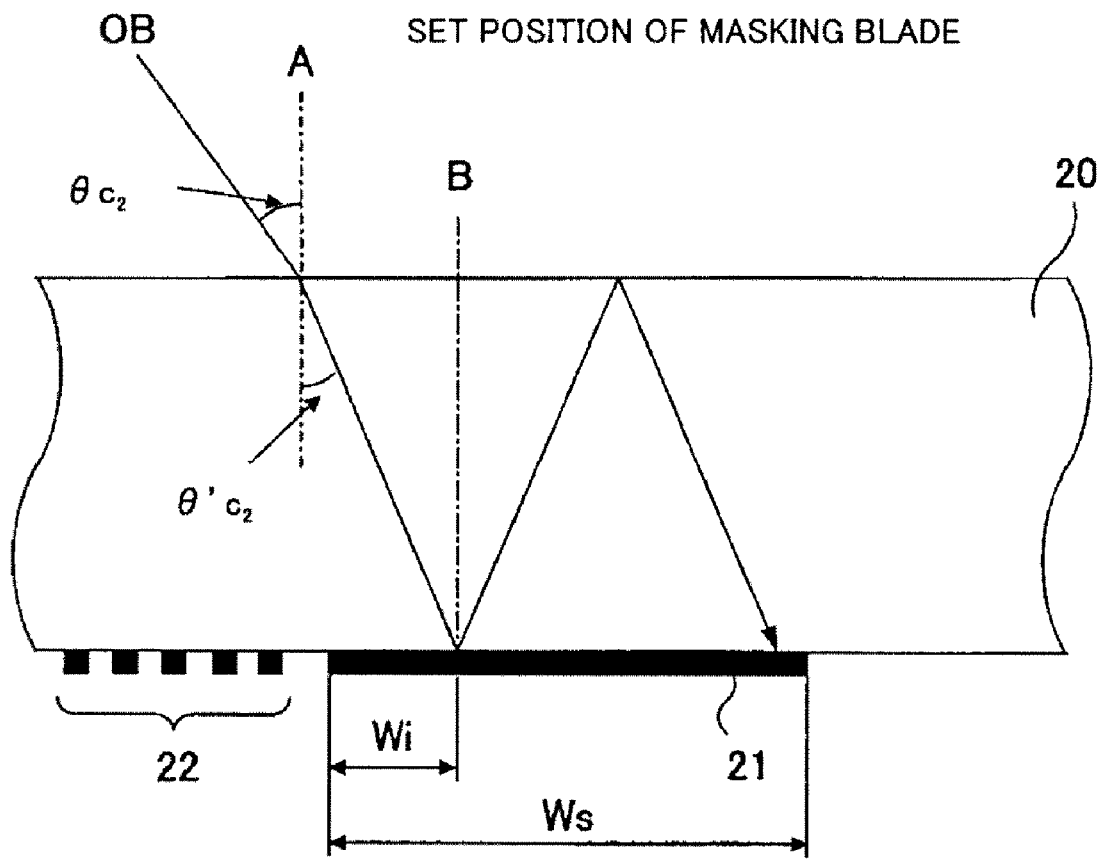
FIG. 3 is a schematic view of the incident light upon the reticle in this embodiment.
Figure 4:
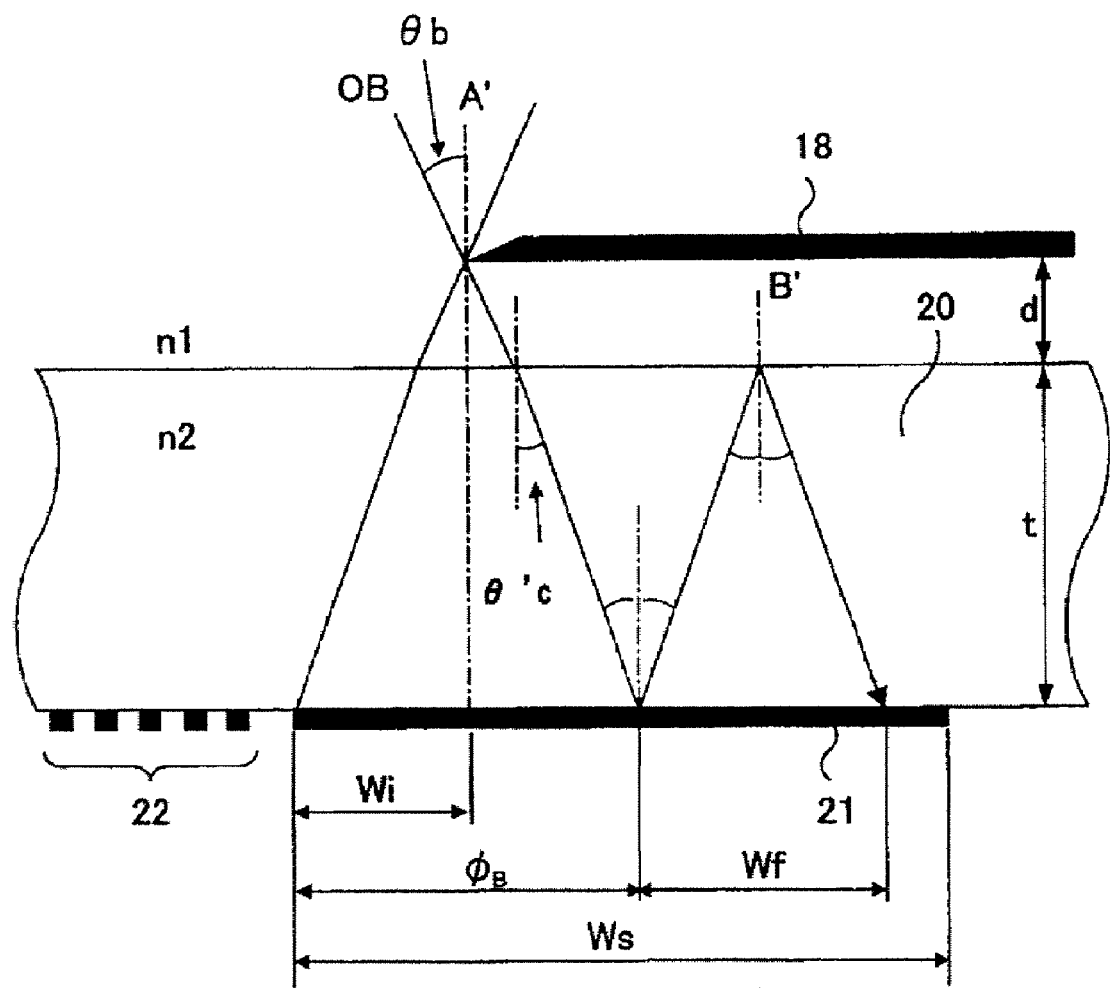
FIG. 4 is a schematic view of the incident light upon the reticle in this embodiment.

The masking blade (field stop) 18 defines a region for illuminating the reticle 20. The controller 50 restricts the field of the masking blade 18. The masking blade 18 has a rectangular aperture as shown in FIG. 2. Here, FIG. 2 is a top view showing the reticle 20 and the masking blade 18. The masking blade 18 viewed from the top has such an aperture that a distance Wi between the patterned area 22 and the aperture edge of the masking blade 18 is smaller than half the width Ws of the light shielding area 21, as discussed later. The masking blade 18 restricts the ray OB incident upon the light shielding area 21 as shown in FIGS. 3 and 4. FIGS. 3 and 4 are schematic views of the reflected lights in the reticle 20. This configuration restrains the unnecessary light of the ray OB having the incident angle $\theta c_2$ from entering the projection optical system 19 and then the adjacent part to the transfer area on the wafer 40. As a result, the CD abnormality is prevented, which thickens or thins the CD at the adjacent part. A control method (or exposure method) of the field of the masking blade 18 will be described later. The controller 50 maintains the aperture size, as long as the aperture of the masking blade 18 is previously set closer to the patterned area 22 than the center of the light shielding area 21 that has the width Ws.

The masking blade 18 is arranged at a position that is strictly or approximately optically conjugate with the reticle 20 plane. Alternatively, the masking blade 18 may be arranged just above the reticle 20 plane as shown in FIG. 4.

The imaging optical system 19 forms an image of the aperture of the masking blade 18 on the reticle 20, and is arranged between the masking blade 18 and the reticle 20.

The reticle 20 is made, for example, quartz, has a circuit pattern to be transferred, and is supported and driven by the reticle stage. The diffracted lights from the reticle 20 pass the projection optical system 30, and are projected onto the wafer 40. The reticle 20 and the wafer 40 are located in an optically conjugate relationship. A pattern of the reticle 20 is transferred onto the wafer 40 by scanning the reticle 20 and the wafer 40 at a speed ratio corresponding to a reduction ratio. The reticle 20 has the light shielding area 21, and the patterned area 22, as shown in FIGS. 3 and 4. The light shielding part 21 shields the unnecessary light outside the patterned area 22. The patterned area 22 is illuminated by the light that passes the masking blade 18. The patterned area 22 has a desired pattern.

The reticle stage supports the reticle 20 using a reticle chuck (not shown), and is connected to a moving mechanism (not shown). The moving mechanism (not shown) includes a linear motor, and can move the reticle 20 by driving the reticle stage in the X-axis direction, Y-axis direction, and Z-axis direction and rotating directions around these axes.

The projection optical system 30 serves to image the light from the object plane onto the image plane, and images the diffracted lights via the pattern of the reticle 20 onto the wafer 40 in this embodiment. The projection optical system 30 may be a dioptric optical system that includes plural lens elements, a catadioptric optical system that includes plural lens elements and at least one concave mirror, etc. For a correction to the chromatic aberration, plural lens elements made of glass materials having different dispersion (or Abbe) values may be used or the diffraction optical element may be configured to provide dispersion in a direction reverse to the lens element.

The wafer 40 is a substrate to be exposed, to which a photoresist is applied. In this embodiment, a focus tilt detection system 50 detects a position of the wafer 40. The wafer 40 is replaced with a liquid crystal substrate or another substrate in another embodiment.

The wafer stage supports the wafer 40 using a wafer chuck (not shown). Similar to the reticle stage, the wafer stage moves the wafer 40 using a linear motor in the XYZ-axes direction, and rotating directions around these axes. A laser interferometer, for example, monitors the positions of the reticle and wafer stages, and these stages are driven at a constant speed ratio. The reticle stage and the projection optical system 30 are provided on the barrel stool that is supported, for example, on the base frame via dampers, and the base frame is placed on the floor.

The focus tilt detection system uses an optical measurement system in this embodiment, and obtains positional information of the surface position of the wafer 40 in the Z-axis direction during exposure. The focus tilt detection system introduces the light to plural measurement points to be measured on the wafer 40, guides each light to each sensor, and detects the tilt of the exposure plane from the positional information or measurement result at the different positions.

The controller 50 has a CPU and a memory, is connected electrically to the illumination apparatus 10, the reticle stage, the wafer stage, and the focus tilt detection system, and controls an operation of the exposure apparatus 1. The controller 50 controls the masking blade 18, and the light incident upon the imaging optical system 19. The controller 50 sets Wi, as shown in FIGS. 3 and 4, so that a position corresponding to the aperture edge of the masking blade 18 is closer to the patterned area 22 than the center of the width Ws of the light shielding area 21. The controller 50 may change a position corresponding to the aperture edge of the masking blade 18 relative the light shielding area 21 in accordance with an illumination condition of the illumination optical system 12. The controller 50 may differently set distances from boundaries between the patterned area and the light shielding area, to positions corresponding to aperture edges of the masking blade 18 in different directions. An operation of the controller 50 will be given below with an exposure method 500 of this embodiment.

Figure 5:
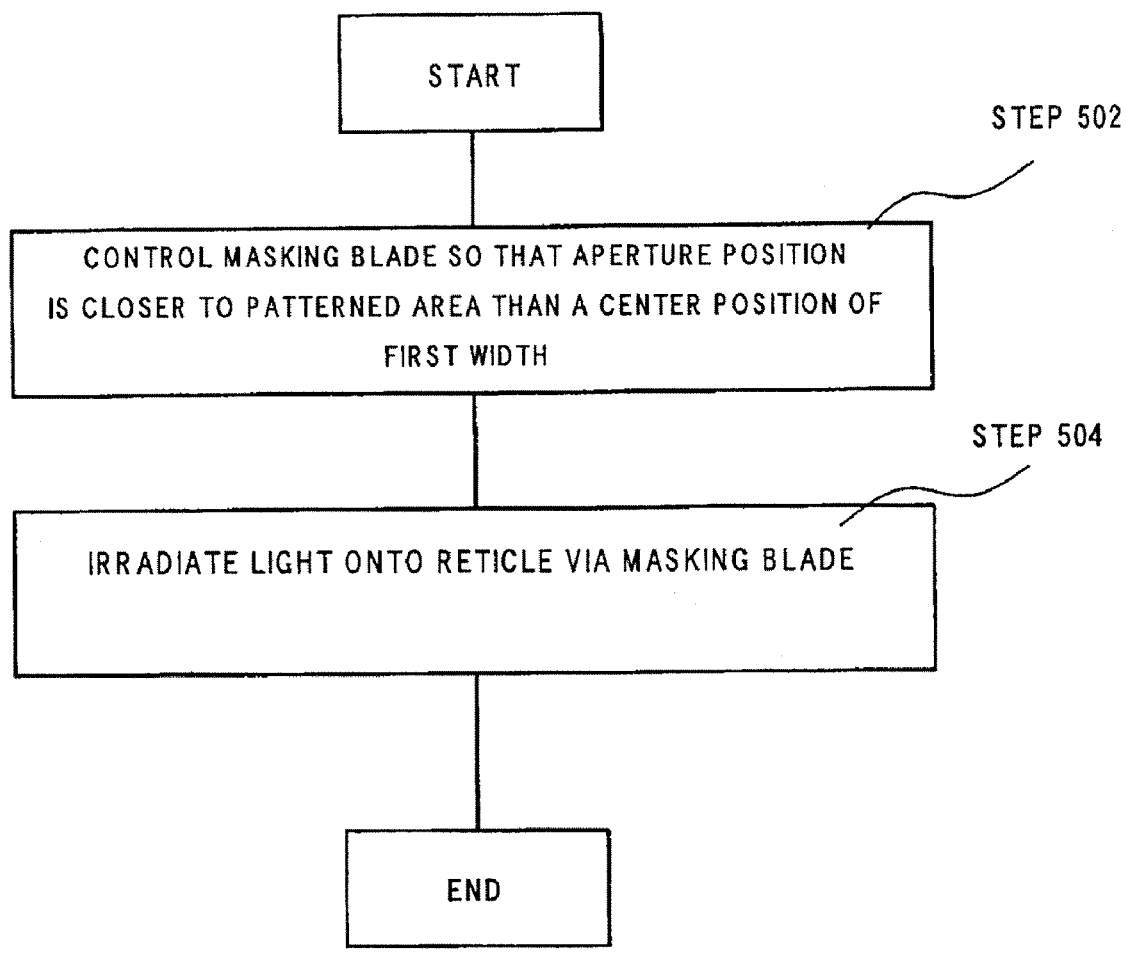
FIG. 5 is a flowchart of an exposure method 500 of this embodiment.

Referring now to FIG. 5, a description will be given of the exposure method 500. Here, FIG. 5 is a flowchart of the exposure method 500 of this embodiment.

The exposure method 500 illuminates the pattern of the reticle 20 using the illumination optical system 10, and exposes the pattern onto the wafer 40. The reticle 20 has the patterned area 22 that has the pattern, and the light shielding area 21 that has the width Ws, and is located around the patterned area 22.

First, the masking blade 18 is arranged so that a position corresponding to the aperture edge of the masking blade 18 can be closer to the patterned area 22 than the center of the width Ws (step 502), as detailed later. The aperture defines a region for illuminating the reticle 20. The condenser lens 17 superposes the lights from the optical integrator 15 on and illuminates the plane on which the masking blade 18 is located. The reticle 20 is illuminated via the masking blade 18 (step 504) The exposure apparatus 1 uniformly illuminates the reticle 20 via the imaging optical system 19. The light incident upon the reticle 20 is transfers the pattern of the reticle 20 onto the wafer 40 in a step-and-scan manner or a step-and-repeat manner.

The step 502 will be described in detail.

Figure 9:
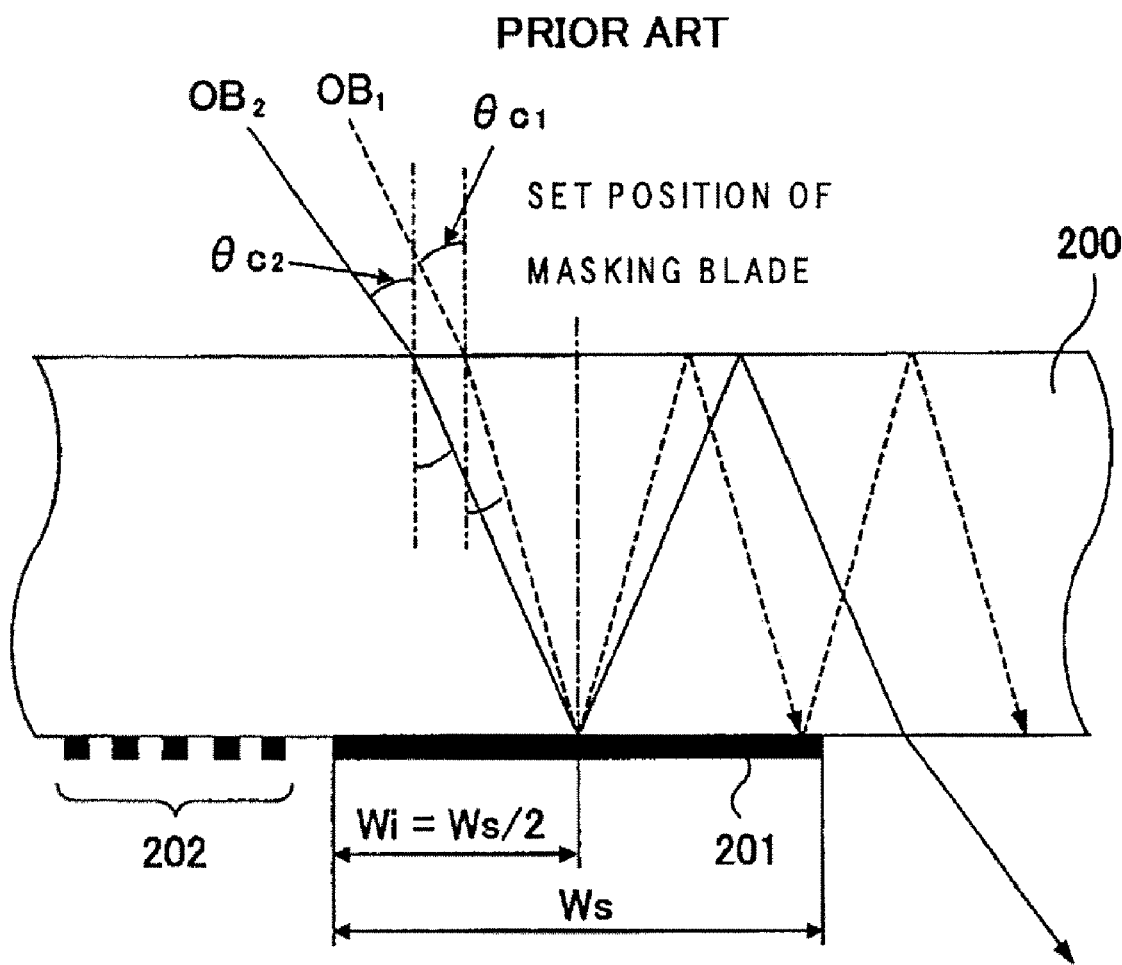
FIG. 9 is a schematic view showing the conventional arrangement of the blade set position and incident light upon the reticle.

Again, FIG. 9 is a schematic view of the incident light upon the reticle 200 in the prior art example that sets a position corresponding to the aperture edge of the masking blade to the center of the light shielding area 201, satisfying Wi=Ws/2. On the other hand, FIG. 3 is a schematic view of the incident light upon the reticle 20 in this embodiment that arranges, different from FIG. 9, the aperture edge of the mask blade 18 closer to the patterned area 22 than the center of the width Ws of the light shielding area 21 on the reticle 20, satisfying Wi<Ws/2. When the aperture edge of the masking blade 18 is arranged closer to the patterned area 22, the ray OB that has the same incident angle $\theta c_2$ as that of the ray OB2 in FIG. 9 can be maintained inside the light shielding area 21 having the width Ws, even when the ray OB is partially reflected on the light shielding area 21 then on the reticle 20's back surface, and finally reaches the reticle pattern plane. Wi is made as small as possible to the extent that Wi<Ws/2, but preferably larger than half a blur amount $\Phi_B$ of the aperture edge of the masking blade 18. The blur amount is a point image intensity distribution of the imaging optical system 19, and contains a spread due to the manufacturing error and the setting error. This is because a state of Wi<$\Phi_B$/2 allows the blur at the aperture edge of the masking blade 18 to enter the patterned area 22, lowers the illuminance around the patterned area 22, and causes the CD abnormality. It is therefore preferable to set a position corresponding to the aperture edge of the masking blade 18 so that Wi satisfies the following Equation 1:

$$\frac{\phi_B}{2} < W_i < \frac{W_s}{2} \qquad \text{EQUATION 1}$$

While this embodiment arranges the imaging optical system 19 between the masking blade 18 and the reticle 20, the masking blade 18 may be located just above the reticle 20 as shown in FIG. 4. When the masking blade 18 is located just above the reticle 20, the masking blade 18 defocuses from the reticle pattern plane, and the blur amount $\Phi_B$ occurs on the reticle pattern plane due to the aperture edge. The blur amount $\Phi_B$ is expressed by the following Equation 2, where t is a thickness of the reticle 20, and d is an interval between the reticle 20 and the masking blade 18. $n_1$ is a refractive index of a medium at the incidence side of the reticle 20. $n_2$ is a refractive index of the reticle 20. NA is a numerical aperture of the projection optical system 30. β is a magnification of the projection optical system 30. σ is a ratio of a numerical aperture of the illumination optical system 12 to a numerical aperture of the projection optical system 30.

$$\phi_B = 2 \cdot d \cdot \tan\{\sin^{-1}(NA \cdot \sigma \cdot \beta)\} + \qquad \text{EQUATION 2}$$
$$2 \cdot t \cdot \tan\left\{\sin^{-1}\left(\frac{n_1}{n_2} \cdot NA \cdot \sigma \cdot \beta\right)\right\}$$

The light that is reflected on the front and back surfaces of the reticle 20 reaches a range Wf outside $\Phi_B$, and Wf is expressed as Wf=2×t×tan θ'c. Thus, the light can reach a range of $\Phi_B$/2+Wf outside the set position of the aperture edge of the masking blade 18. The width Ws of the light shielding area 21 necessary to prevent the leakage of the light becomes 2×($\Phi_B$/2+Wf)=$\Phi_B$+2Wf when the masking blade 18 is set to the center of the light $\Phi_B$ shielding area 21. On the other hand, when the position corresponding to the aperture edge of the masking blade 18 is set such that the blur amount becomes about half (i.e., Wi=$\Phi_B$/2), as shown in FIG. 4, the width Ws of the light shielding area 21 necessary to prevent the leakage of the light becomes Wi+($\Phi_B$/2)+Wf=$\Phi_B$+Wf, narrower than that of the conventional arrangement that sets the position of the aperture edge of the masking blade 18 to the center of the light shielding area 21. In addition, the light shielding area 21 even with the same width can improve the shielding characteristic to the light having a higher incident NA, and reduce the flare to the adjacent part.

As a result, this embodiment can provide an exposure apparatus, an exposure method, and a device manufacturing method, which can provide the cost reduction as well as the fine patterning.

Figure 6A:
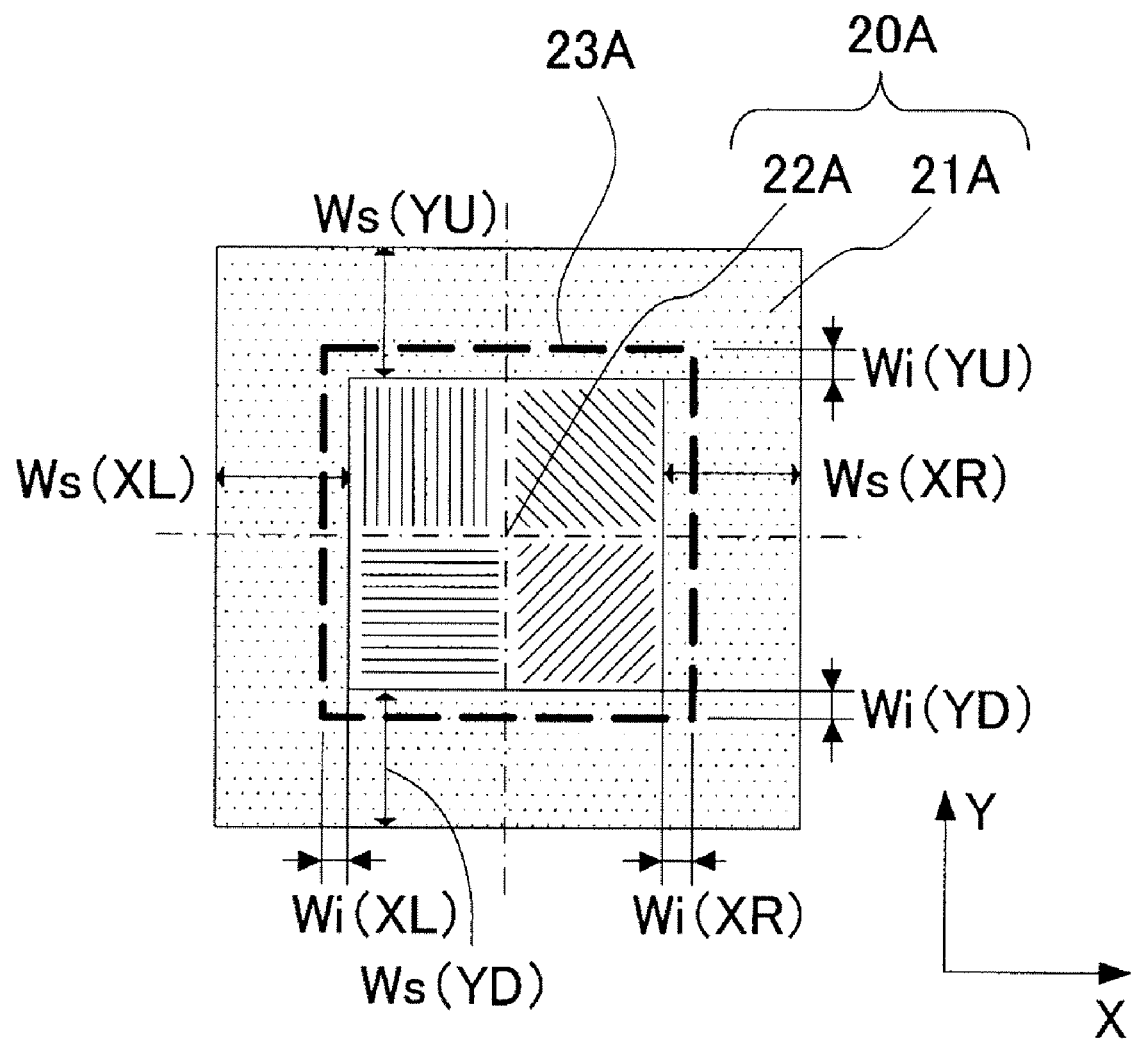
FIGS. 6A and 6B are schematic views of a variation of the blade set position and incident light upon the reticle shown in FIG. 4.
Figure 6B:
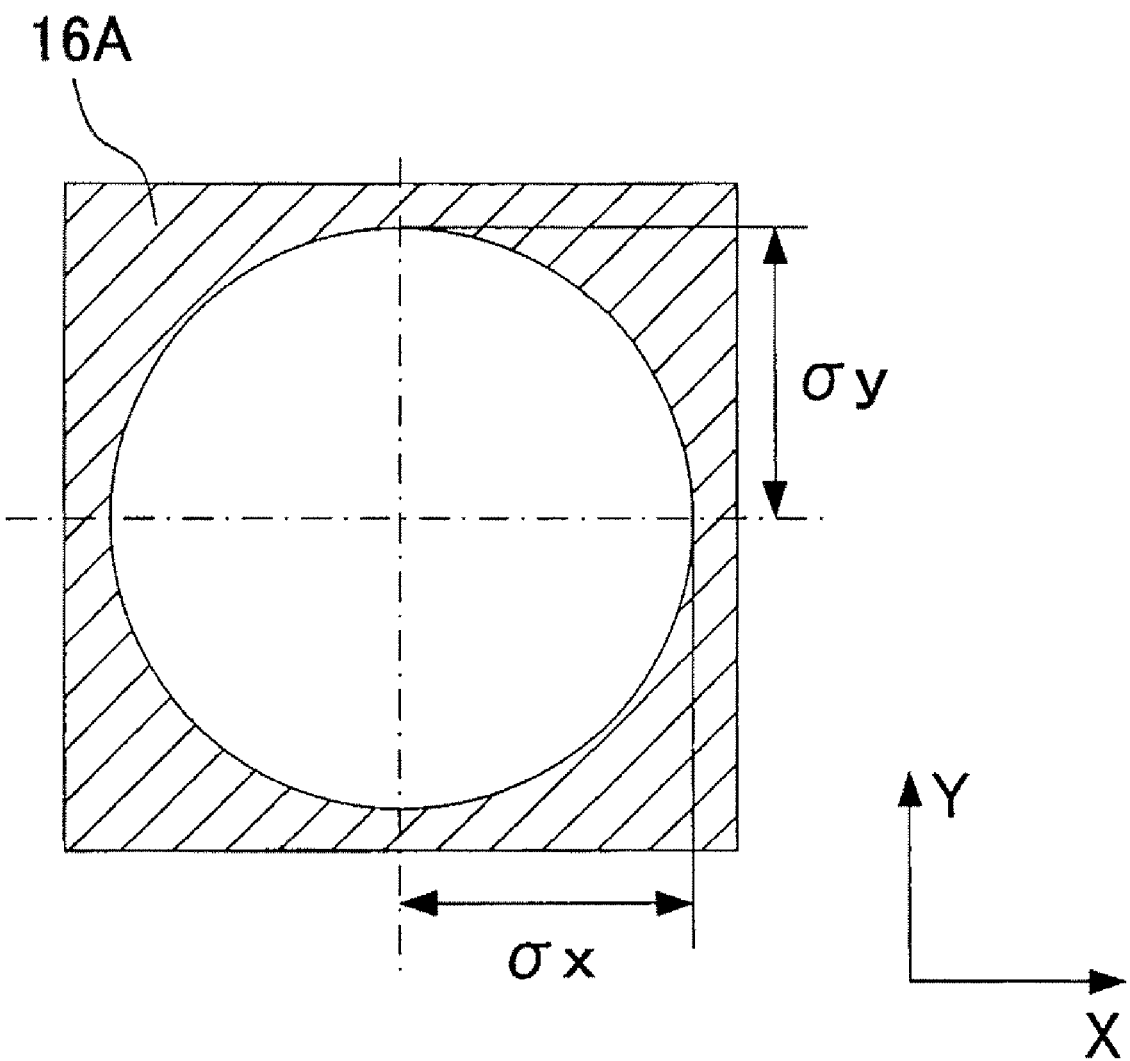

Referring now to FIGS. 6A to 8B, a description will be given of a second embodiment as a variation. Here, FIG. 6A is a view showing a set position 23A corresponding to the aperture edge of the masking blade 18 expressed by a thick broken-line rectangle, and a light shielding area 21A on the reticle 20A, when the illumination shape for illuminating the reticle 20A is in point symmetry. FIG. 6B is one illustrative illumination shape. As shown in FIG. 6B, the illumination NA is the same between the X and Y directions ($\sigma x = \sigma y$). Thus, distances Wi(XL), Wi(XR), Wi(YU), and Wi(YD) between the set positions corresponding to the aperture edges of the masking blade 18 and the light shielding area 21A are made equal to each other on the reticle 20A. The light shielding area 21A has also the same widths Ws(XL), Ws(XR), Ws(YU), and Ws(YD).

FIGS. 7A to 8B show illumination shapes for illuminating the reticles 20B and 20C, but these illumination shapes are not in point symmetry and the illumination NAs differ between the X and Y directions.

Figure 7A:
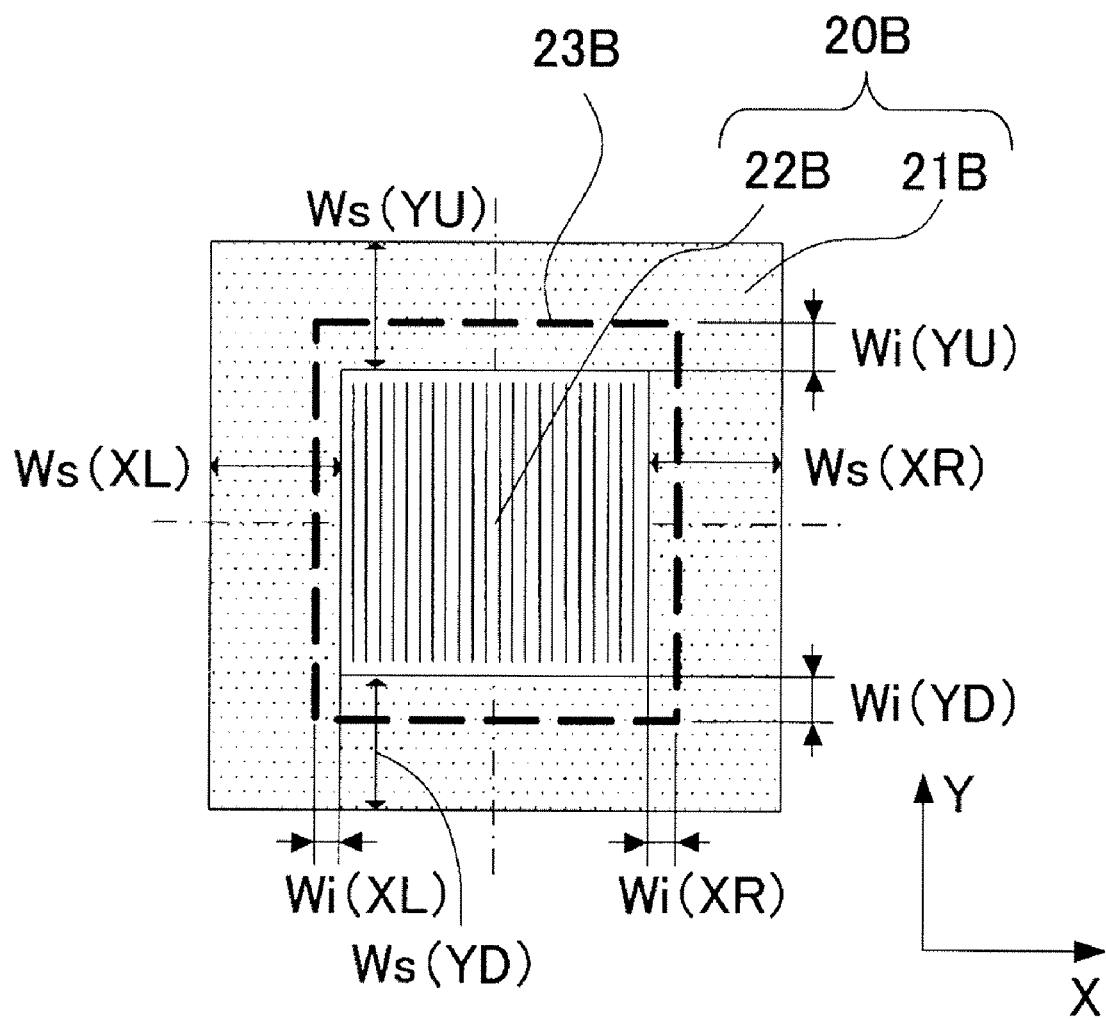
FIGS. 7A and 7B are schematic views of a variation of the blade set position and incident light upon the reticle shown in FIG. 4.
Figure 7B:
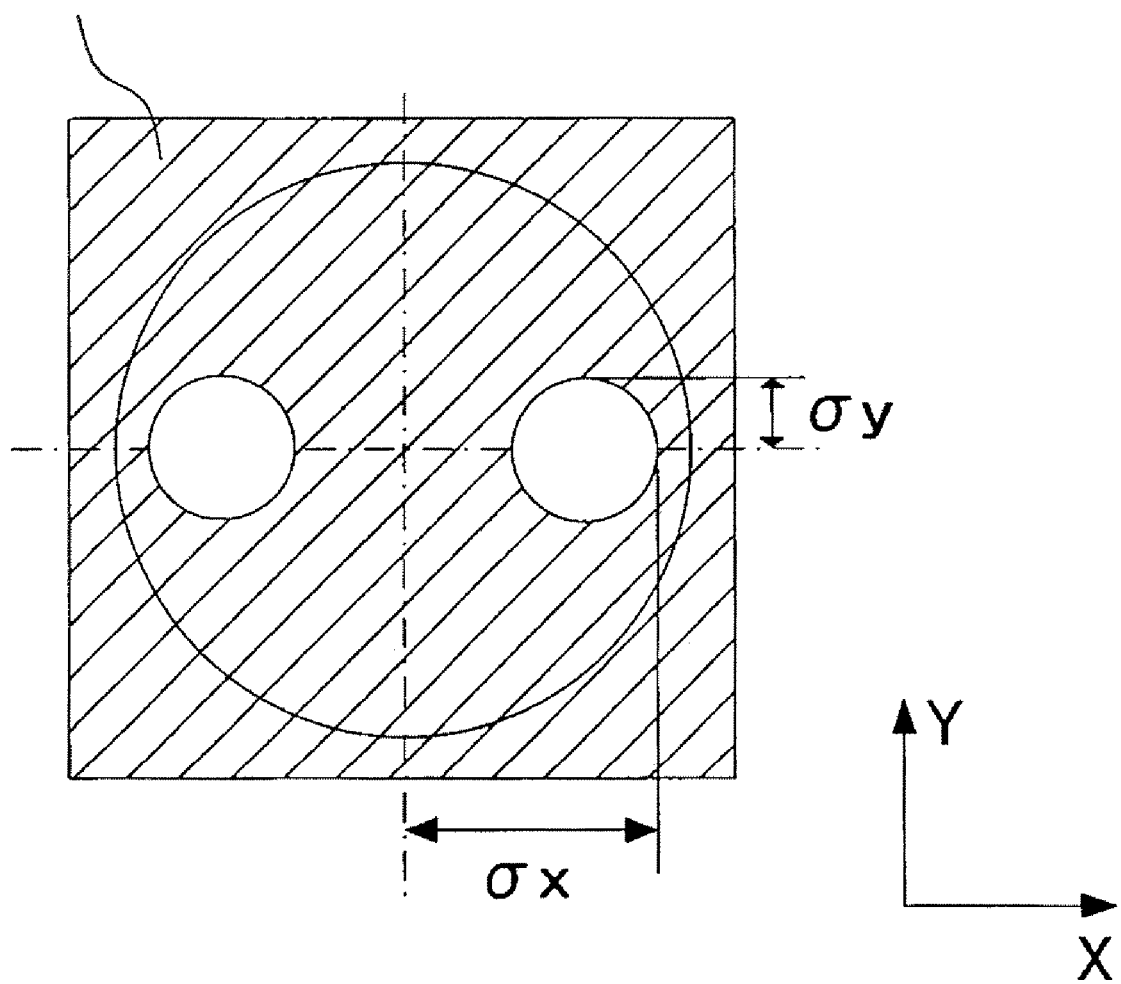
Figure 8A:
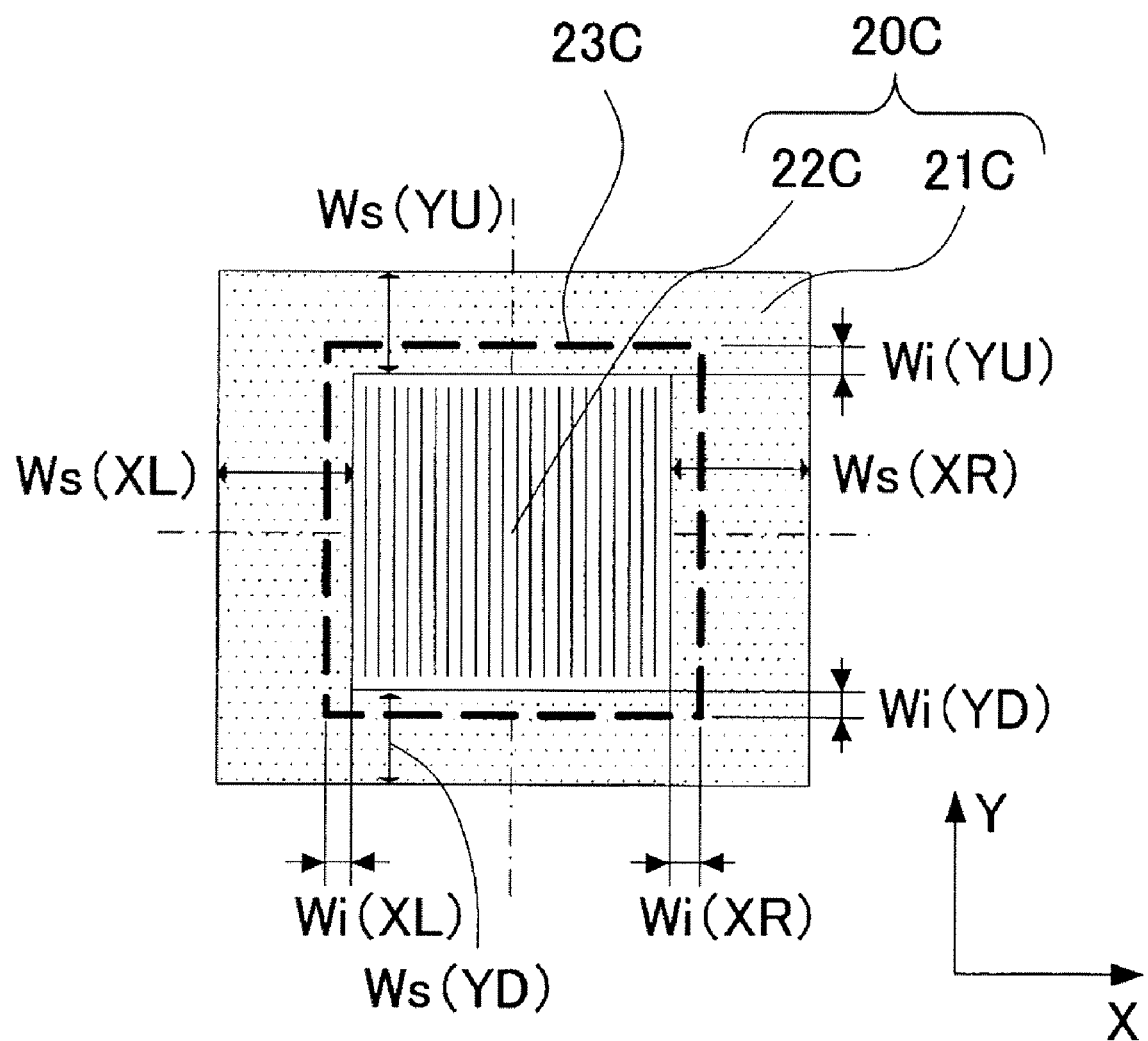
FIGS. 8A and 8B are schematic views of a variation of the blade set position and incident light upon the reticle shown in FIG. 4.
Figure 8B:
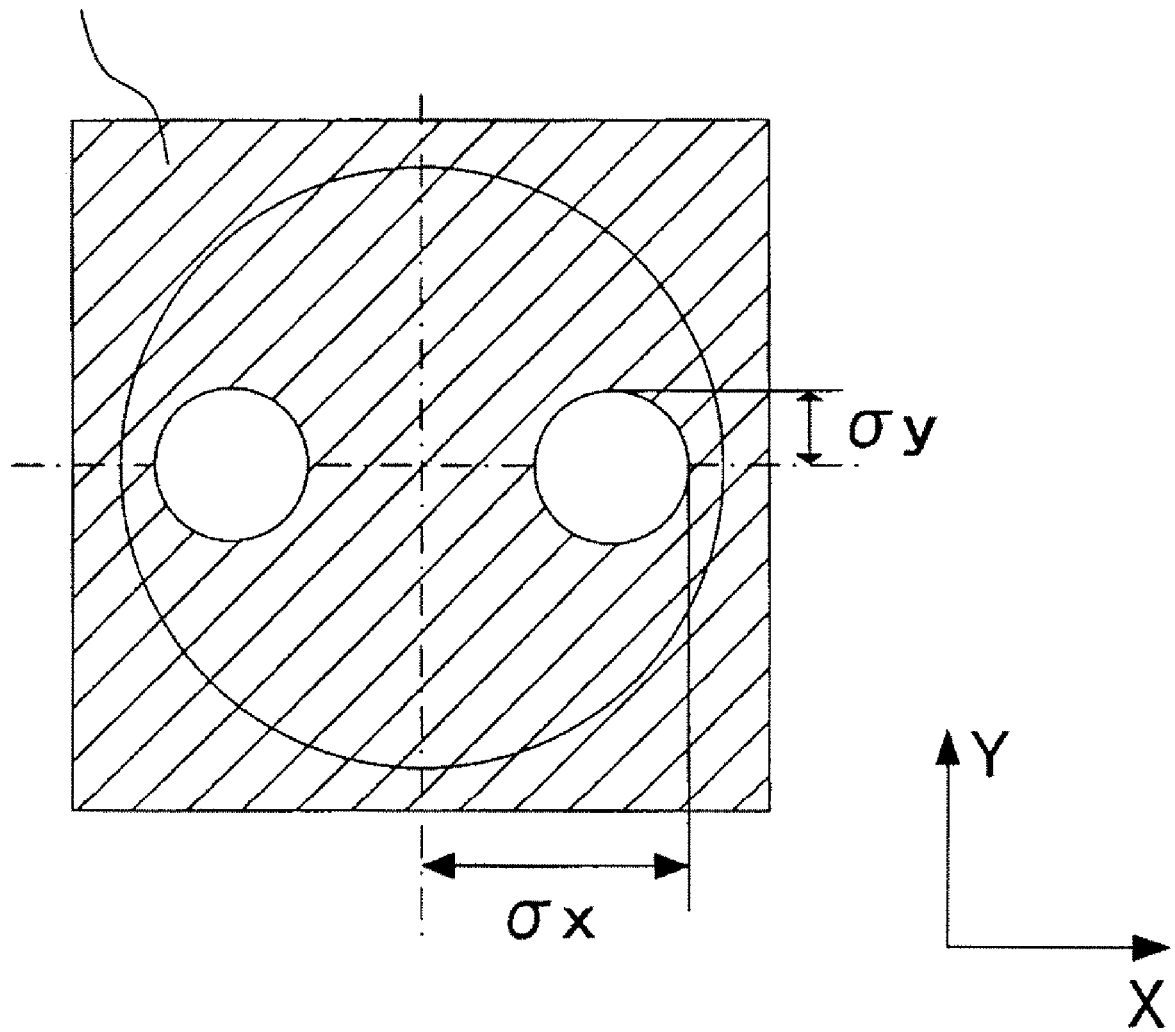

FIG. 7A is a view showing a set position 23B corresponding to the aperture edge of the masking blade 18 expressed by a thick broken-line rectangle, and a light shielding area 21B on the reticle 20B, when the illumination shape for illuminating the reticle 20B is not in point symmetry. FIG. 7B is an X-directional dipole illumination shape. FIG. 8A is a view showing a set position 23C corresponding to the aperture edge of the masking blade 18 expressed by a thick broken-line rectangle, and a light shielding area 21C on the reticle 20C, when the illumination shape for illuminating the reticle 20C is not in point symmetry. FIG. 8B is an X-directional dipole illumination shape, similar to that shown in FIG. 7B. A $\sigma$ value representing the illumination NA is not the same between the X and Y directions.

On the reticles 20B and 20B, blur amounts caused by the aperture edge of the masking blade 18 are different between the X and Y directions. Light spreading regions due to the reflections on the front and back surfaces of the reticles 20B and 20C are also different between the X and Y directions.

The set positions 23B corresponding to the aperture edges of the masking blade 18 may be different between the X and Y directions as shown in FIG. 7A. In FIG. 7A, the light spreading region is small due to the reflections on the front and back surfaces of the reticle 20B in the Y direction, and the set positions corresponding to the aperture edges of the masking blade 18 in the Y direction are made wider than those in the X direction, i.e., each of Wi(YU) and Wi(YD) being greater than each of Wi(XL) and Wi(XR). Alternatively, as shown in FIG. 8A, the width of the light shielding area 21 in the Y direction can be made narrower than that in the X direction, i.e., each of Ws(YU) and Ws(YD) being greater than each of Ws(XL) and Ws(XR). In accordance with the blur amount of the masking blade 18 due to the illumination shape, and the light spreading region due to the reflections of the front and back surfaces of the reticle 20C, at least one of the set position of the aperture edge of the masking blade 18 and the width of the light shielding area may be changed. Thus, the flare that would otherwise influence the adjacent part can be reduced.

As a result, this embodiment can provide an exposure apparatus, an exposure method, and a device manufacturing method, which can provide the cost reduction as well as the fine patterning.

Figure 10:
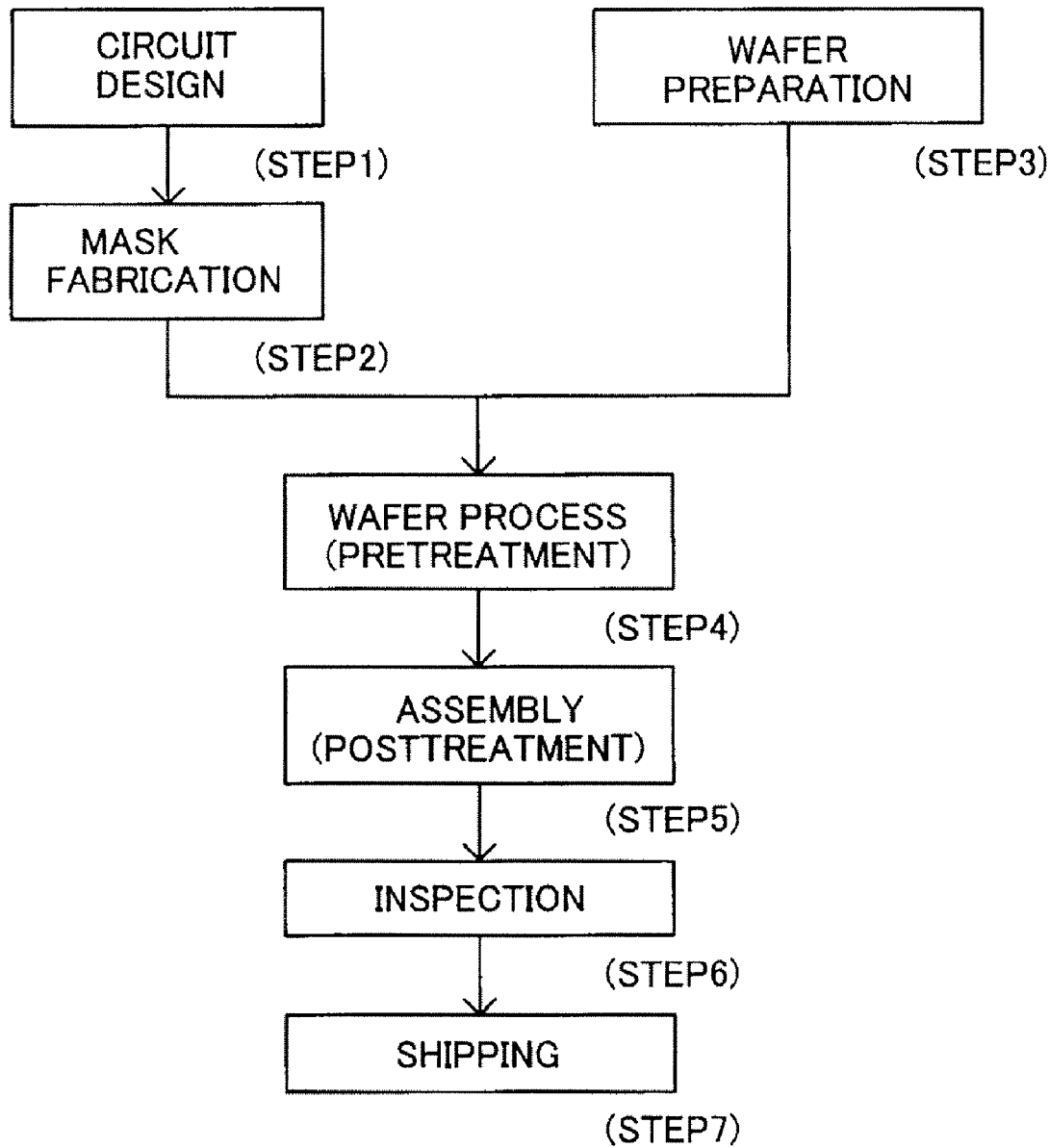
FIG. 10 is a flowchart for explaining a method for manufacturing a device (semiconductor chips such as ICs, LSIs, LCDs, CCDs, etc.).
Figure 11:
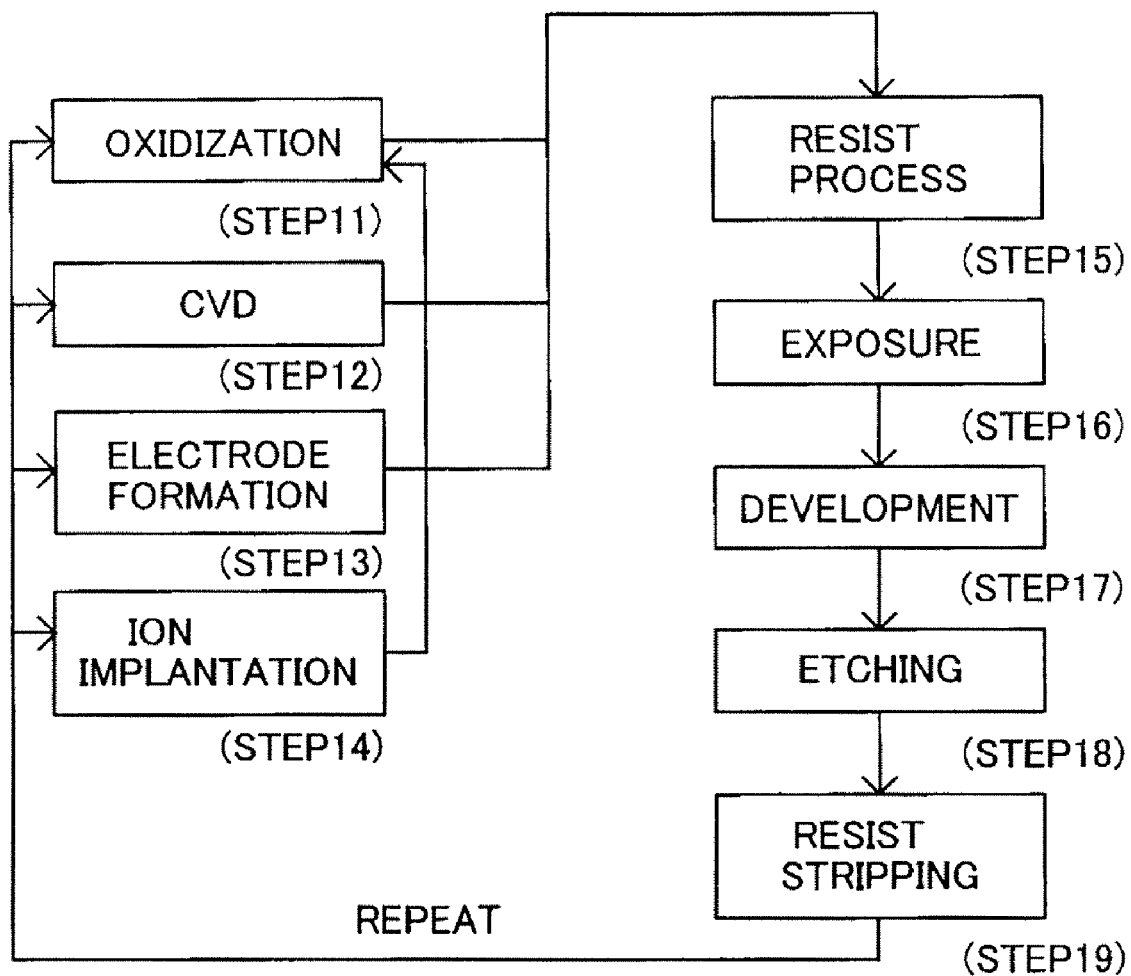
FIG. 11 is a detailed flowchart for Step 4 shown in FIG. 10.

Referring now to FIGS. 10 and 11, a description will now be given of an embodiment of a device manufacturing method using the exposure apparatus 1. FIG. 10 is a flowchart for explaining a fabrication of devices (i.e., semiconductor chips such as IC and LSI, liquid crystal panels, CCDs, etc.). Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4 shown in FIG. 12. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a reticle pattern onto the wafer. Step 17 (development) develops the exposed wafer 47. Step 18 (etching) etches parts other than a developed resist image. Step 19 (resist stripping) removes disused resist after etching. These steps are repeated, and multilayer circuit patterns are formed on the wafer. The manufacturing method of this embodiment can manufacture higher quality devices than ever.

Further, the present invention is not limited to these preferred embodiments, and various variations and modifications may be made without departing from the scope of the present invention.

This application claims a benefit of priority based on Japanese Patent Application No. 2005-369329, filed on Dec. 22, 2005, which is hereby incorporated by reference herein in its entirety as if fully set forth herein.

What is claimed is:

1. An exposure method for exposing a pattern of a reticle which has a patterned area that has the pattern, and a light shielding area that has a width and that is provided around the patterned area, onto a substrate via a projection optical system by illuminating the reticle using an illumination optical system, said exposure method comprising the steps of:

controlling a field stop which has an aperture defining a region in which the reticle is illuminated so that a position corresponding to an edge of the aperture in the field stop is closer to the patterned area side than a center of the width of the light shielding area on the reticle; and illuminating the reticle via the field stop, wherein the controlling step changes the position corresponding to the edge of the aperture in the field stop in accordance with a shape of an effective light source of the illumination optical system.

2. An exposure method according to claim 1, wherein the illumination optical system includes an imaging optical system between the field stop and the reticle, and the field stop is arranged at a position that is optically conjugate with the reticle.

3. An exposure method according to claim 2, wherein $$\frac{\phi_B}{2} < W_i < \frac{W_s}{2}$$

is met, where ΦB is a point image intensity distribution on the reticle, of the aperture in the field stop by the imaging optical system, Ws is the width of the light shielding area, and Wi is a distance from a boundary between the patterned area and the light shielding area, to the position corresponding to the edge of the aperture in the field stop.

4. An exposure method according to claim 1, wherein the field stop is arranged above the reticle.

5. An exposure method according to claim 4, wherein $$\frac{\phi_B}{2} < W_i < \frac{W_s}{2}$$

$$\phi_B = 2 \cdot d \cdot \tan\{\sin^{-1}(NA \cdot \sigma \cdot \beta)\} + 2 \cdot t \cdot \tan\left\{\sin^{-1}\left(\frac{n_1}{n_2} \cdot NA \cdot \sigma \cdot \beta\right)\right\}$$

being met, where ΦB is a blur amount on the reticle, of the aperture in the field stop, Ws is the width of the light shielding area, t is a thickness of the reticle, d is an interval between the reticle and the field stop, n1 is a refractive index of a medium at an incidence side of the reticle, n2 is a refractive index of the reticle, Wi is a distance from a boundary between the patterned area and the light shielding area, to the position corresponding to the edge of the aperture in the field stop, NA is a numerical aperture of the projection optical system, β is a projection magnification of the projection optical system, and σ is a ratio of a numerical aperture of the illumination optical system to a numerical aperture of the projection optical system.

6. An exposure method according to claim 1 wherein said controlling step differently sets distances from boundaries between the patterned area and the light shielding area, to positions corresponding to edges of the aperture in the field stop in different directions.

7. An exposure method according to claim 6, wherein when the different directions are defined as X direction and Y direction that are orthogonal to the each other, the controlling step differently sets distances from boundaries between the patterned area and the light shielding area, to positions corresponding to edges of the aperture in the field stop in X direction and the Y direction when the shape of the effective light source differs between the X direction and the Y direction.

8. An exposure apparatus for exposing a pattern of a reticle that has a patterned area that has the pattern, and a light shielding area that has a width and that is provided around the patterned area, onto a substrate via a projection optical system, said exposure apparatus comprising:

a field stop which has an aperture defining a region in which the reticle is illuminated;

a controller for controlling the field stop so that a position corresponding to an edge of the aperture in the field stop is closer to the patterned area side than a center of the width of the light shielding area on the reticle; and an illumination optical system for illuminating the pattern of the reticle, the illumination optical system including the field stop, wherein the controller changes the position corresponding to the edge of the aperture in the field stop in accordance with a shape of an effective light source of the illumination optical system.

9. A device manufacturing method comprising the steps of:

exposing a substrate using an exposure method for exposing a pattern of a reticle which has a patterned area that has the pattern, and a light shielding area that has a width and that is provided around the patterned area, onto the substrate via a projection optical system by illuminating the reticle using an illumination optical system; and developing the substrate that has been exposed, wherein the exposure method includes the steps of:

controlling a field stop which has an aperture defining a region in which the reticle is illuminated so that a position corresponding to an edge of the aperture in the field stop is closer to the patterned area side than a center of the width of the light shielding area on the reticle; and illuminating the reticle via the field stop, and wherein the controlling step changes the position corresponding to the edge of the aperture in the field stop in accordance with a shape of an effective light source of the illumination optical system.

10. A device manufacturing method comprising the steps of:

exposing a substrate using an exposure apparatus for exposing a pattern of a reticle that has a patterned area that has the pattern, and a light shielding area that has a width and that is provided around the patterned area, onto a substrate via a projection optical system; and developing the substrate that has been exposed, wherein the exposure apparatus includes:

a field stop which has an aperture defining a region in which the reticle is illuminated;

a controller for controlling the field stop so that a position corresponding to an edge of the aperture in the field stop is closer to the patterned area side than a center of the width of the light shielding area on the reticle; and an illumination optical system for illuminating the pattern of the reticle, the illumination optical system including the field stop, and wherein the controller changes the position corresponding to the edge of the aperture in the field stop in accordance with a shape of an effective light source of the illumination optical system.

* * * * *